(12) United States Patent
Nakamura et al.

(10) Patent No.: US 11,946,143 B2
(45) Date of Patent: Apr. 2, 2024

(54) LAMINATE

(71) Applicant: Arisawa Mfg. Co., Ltd., Joetsu (JP)

(72) Inventors: Kenji Nakamura, Niigata (JP); Yoshihiko Konno, Niigata (JP); Hiroyuki Matsuyama, Niigata (JP); Makoto Tai, Niigata (JP); Shuichi Fujita, Niigata (JP)

(73) Assignee: Arisawa Mfg. Co., Ltd., Niigata (JP)

( * ) Notice: Subject to any disclaimer, the term of this patent is extended or adjusted under 35 U.S.C. 154(b) by 490 days.

(21) Appl. No.: 17/273,908

(22) PCT Filed: Sep. 4, 2019

(86) PCT No.: PCT/JP2019/034877
§ 371 (c)(1),
(2) Date: Mar. 5, 2021

(87) PCT Pub. No.: WO2020/050338
PCT Pub. Date: Mar. 12, 2020

(65) Prior Publication Data
US 2021/0348276 A1 Nov. 11, 2021

(30) Foreign Application Priority Data
Sep. 5, 2018 (JP) .................. 2018-166271

(51) Int. Cl.
C23C 18/28 (2006.01)
H05K 1/03 (2006.01)
(Continued)

(52) U.S. Cl.
CPC ............ *C23C 18/28* (2013.01); *H05K 1/036* (2013.01); *H05K 3/0064* (2013.01); *H05K 3/381* (2013.01);
(Continued)

(58) Field of Classification Search
CPC ....... B32B 15/08; B32B 15/088; B32B 27/18; B32B 27/34; C23C 18/165;
(Continued)

(56) References Cited

U.S. PATENT DOCUMENTS

| 5,462,773 A | 10/1995 | Swift et al. |
| 2004/0018131 A1 | 1/2004 | Izumida et al. |
| 2010/0266850 A1 | 10/2010 | Shimoohsako et al. |

FOREIGN PATENT DOCUMENTS

| JP | H06-232535 A | 8/1994 |
| JP | 2004-152852 A | 5/2004 |

(Continued)

OTHER PUBLICATIONS

International Search Report and Written Opinion dated Nov. 5, 2019 for Application No. PCT/JP2019/034877.

*Primary Examiner* — Timothy J Thompson
*Assistant Examiner* — Guillermo J Egoavil
(74) *Attorney, Agent, or Firm* — Wolf, Greenfield & Sacks, P.C.

(57) ABSTRACT

A laminate comprising a substrate; and a plating-forming layer disposed on at least one surface of both surfaces of the substrate and containing a thermoplastic resin and a plating catalyst, wherein the plating-forming layer further satisfies conditions of the following (1) and/or (2),
(1) the plating-forming layer contains a dispersing agent for dispersing the plating catalyst
(2) an abundance of the plating catalyst on a surface side of the plating-forming layer is higher than an abundance of the plating catalyst on the substrate side of the plating-forming layer.

9 Claims, 1 Drawing Sheet

(51) Int. Cl.
*H05K 3/00* (2006.01)
*H05K 3/38* (2006.01)

(52) U.S. Cl.
CPC .............. *H05K 2203/061* (2013.01); *H05K 2203/0716* (2013.01); *H05K 2203/072* (2013.01)

(58) Field of Classification Search
CPC . C23C 18/1653; C23C 18/2086; C23C 18/28; C23C 18/30; C23C 18/31; C25D 5/56; H05K 1/036; H05K 1/0393; H05K 1/03; H05K 3/0064; H05K 3/022; H05K 3/381; H05K 3/387; H05K 3/00; H05K 3/38; H05K 2203/061; H05K 2203/0716; H05K 2203/072
USPC ........................................................ 174/259
See application file for complete search history.

(56) References Cited

FOREIGN PATENT DOCUMENTS

| | | | | |
|---|---|---|---|---|
| JP | 2005-116745 A | 4/2005 | | |
| JP | 2007-165931 A | 6/2007 | | |
| JP | 2013080733 A | * 5/2013 | ............. | H05K 3/421 |
| JP | 2016-194150 A | 11/2016 | | |
| WO | WO 2009/075212 A1 | 6/2009 | | |
| WO | WO 2018/151073 A1 | 8/2018 | | |

* cited by examiner

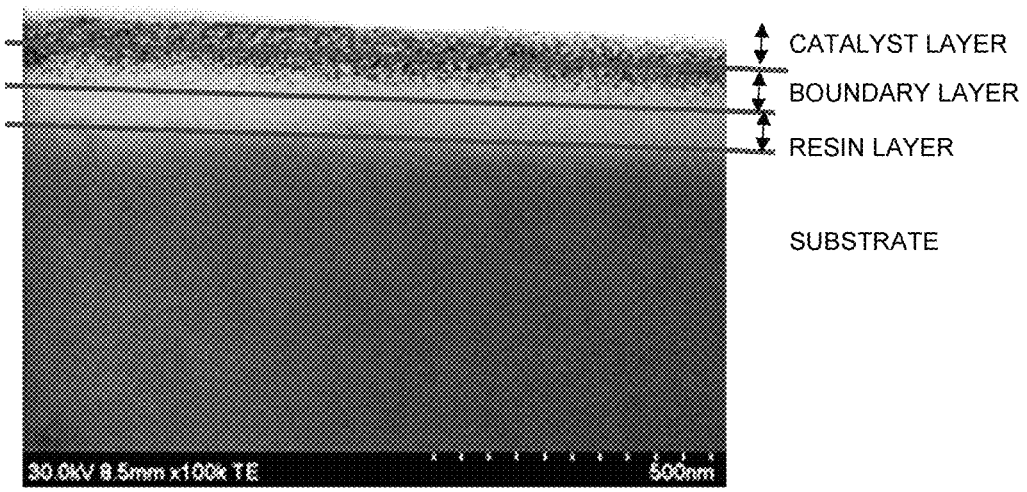

LAMINATE

CROSS-REFERENCE TO RELATED APPLICATIONS

This application is a national stage filing under 35 U.S.C. 371 of International Patent Application No. PCT/JP2019/034877, filed Sep. 4, 2019, which claims priority to Japanese Application No. 2018-166271, filed Sep. 5, 2018. The entire contents of these applications are incorporated herein by reference in their entirety.

TECHNICAL FIELD

The present invention relates to a laminate.

BACKGROUND ART

In recent years, with high integration of semiconductor circuits, the formation of a finer wiring circuit in a printed circuit has been required. In order to form a fine wiring circuit, it is necessary to decrease the thickness of wiring. However, problems are that even thin metal foil has a thickness of 2 μm, and therefore the fine circuit-forming properties are insufficient, and the productivity decreases.

For such problems, Patent Literature 1 discloses that a laminate in which a polymer film, a plating-forming layer containing a thermoplastic resin having crystallinity, and a plating layer are laminated in this order is a material capable of forming a fine circuit, and further the adhesiveness and the solder heat resistance in the plating-forming layer and the plating layer can be improved.

CITATION LIST

Patent Literature

Patent Literature 1: WO 2009075212

SUMMARY OF INVENTION

Technical Problem

However, further improvement of adhesiveness in the normal state and solder heat resistance in good balance is required for the laminate in Patent Literature 1.

Accordingly, the present invention provides a laminate in which adhesiveness in the normal state and solder heat resistance can be improved in good balance.

Solution to Problem

The present inventors have studied diligently in order to solve the above problem, and, as a result, found that the above problem can be solved by a laminate comprising a substrate, and a plating-forming layer disposed on at least one surface of both surfaces of the substrate and containing a thermoplastic resin and a plating catalyst, wherein the plating-forming layer satisfies particular conditions. Thus, the present inventors have completed the present invention. Specifically, the present invention is as follows.

[1]
A laminate comprising:
 a substrate; and
 a plating-forming layer disposed on at least one surface of both surfaces of the substrate and containing a thermoplastic resin and a plating catalyst, wherein the plating-forming layer further satisfies conditions of the following (1) and/or (2),
 (1) the plating-forming layer contains a dispersing agent for dispersing the plating catalyst
 (2) an abundance of the plating catalyst on a surface side of the plating-forming layer is higher than an abundance of the plating catalyst on the substrate side of the plating-forming layer.

[2]
The laminate of [1], wherein the dispersing agent is a compound that interacts with and binds to a metal atom contained in the plating catalyst.

[3]
The laminate of [2], wherein an end group of the compound is a functional group containing a nitrogen atom.

[4]
The laminate of any of [1] to [3], wherein the plating-forming layer comprises a resin layer containing the thermoplastic resin, and a catalyst layer disposed on the resin layer and containing the plating catalyst.

[5]
The laminate of [4], wherein the catalyst layer contains the dispersing agent.

[6]
The laminate of [4] or [5], wherein the plating-forming layer further comprises a boundary layer which is disposed between the resin layer and the catalyst layer and in which the plating catalyst and the dispersing agent infiltrate into the thermoplastic resin.

[7]
The laminate of any of [1] to [6], wherein the substrate is a thermosetting polyimide resin.

[8]
The laminate of any of [1] to [7], wherein the thermoplastic resin is a thermoplastic polyimide resin.

[9]
The laminate of any of [1] to [8], wherein the plating catalyst contains palladium and/or silver.

[10]
The laminate of any of [1] to [9], further comprising a metal plating layer disposed on the plating-forming layer.

Advantageous Effects of Invention

According to the present invention, a laminate in which adhesiveness in the normal state and solder heat resistance can be further improved in good balance can be provided.

BRIEF DESCRIPTION OF DRAWING

FIG. 1 shows a cross-sectional view of a laminate observed using a scanning electron microscope, in Example 1.

DESCRIPTION OF EMBODIMENTS

A mode for carrying out the present invention (hereinafter referred to as "this embodiment") will be described in detail below. The present invention is not limited to the following embodiment, and various modifications can be made without departing from the spirit thereof.

[Laminate]

The laminate of this embodiment comprises a substrate; and a plating-forming layer disposed on at least one surface of both surfaces of the substrate and containing a thermoplastic resin and a plating catalyst.

The plating-forming layer further satisfies the conditions of the following (1) and/or (2).
 (1) the plating-forming layer contains a dispersing agent for dispersing the plating catalyst
 (2) the abundance of the plating catalyst on the surface side of the plating-forming layer ($C_a$) is higher than the abundance of the plating catalyst on the substrate side of the plating-forming layer ($C_b$).

When the plating-forming layer satisfies the conditions of the above (1) and/or (2), the adhesiveness in the normal state and the solder heat resistance can be improved in good balance, for example, the adhesiveness focused on the assumption of long-term reliability is excellent, in the laminate comprising the plating-forming layer. Here, the adhesiveness focused on the assumption of long-term reliability refers to, for example, the property that a decrease in adhesiveness is sufficiently suppressed even if heat treatment at 150° C. is performed.

When the plating-forming layer satisfies the conditions of (1) and/or (2), the adhesiveness in the normal state, the adhesiveness focused on the assumption of long-term reliability, and the solder heat resistance can be improved in good balance in the laminate. A factor of this is considered as follows.

A laminate used for a printed circuit material or the like is composed of a substrate, a plating-forming layer formed on one surface of the substrate and containing a thermoplastic resin and a plating catalyst, and a metal plating layer formed on the plating-forming layer. Here, a factor of insufficient adhesiveness (adhesiveness in the normal state and adhesiveness focused on the assumption of long-term reliability) and solder heat resistance of such a laminate is considered to be that the abundance of the metal (catalytic metal) contained in the plating catalyst is low in the vicinity of the interface between the plating-forming layer and the metal plating layer. In order to increase the abundance of the catalytic metal in the vicinity of the above interface, a dispersing agent for dispersing the plating catalyst is contained in the plating-forming layer, and the abundance of the plating catalyst in the plating-forming layer is controlled. Thus, the proportion of contact of the plating metal with the catalytic metal increases. It is considered that as a result, the catalytic metal and the plating metal are likely to be in contact with each other, and the adhesiveness (adhesiveness in the normal state and adhesiveness focused on the assumption of long-term reliability) and solder heat resistance of the laminate improve.

However, the factor is not limited to this.

(Substrate)

The resin in the substrate is not particularly limited, and examples thereof include thermosetting polyimide resins, liquid crystal polymers, polyphenylene sulfide, syndiotactic polystyrene, polyethylene terephthalate, polyethylene naphthalate, polycarbonates, polybutylene terephthalate, polyether ether ketone, polyether sulfone, polyphenylene ether, and fluorine resins. One of these resins is used alone, or two or more of these resins are used in combination. Among these, the resin is preferably a thermosetting polyimide resin from the viewpoint of better mechanical characteristics, better thermal characteristics, and better dimensional stability during heating. In a flexible printed circuit in which a high frequency signal is transmitted, the resin is preferably a liquid crystal polymer or a fluorine resin from the viewpoint of dielectric characteristics. Liquid crystal polymers and fluorine resins have a low water absorption rate, and therefore the moist heat resistance characteristics, the dimensional stability under high humidity, and the peel strength after moisture absorption treatment are also good.

(Thermosetting Polyimide Resin)

The thermosetting polyimide resin refers to, for example, a polyimide resin in which the modulus at 300° C. is maintained at 20% or more with respect to the modulus at 30° C. The modulus is obtained, for example, by a DMA (dynamic viscoelasticity measurement) method. The thermosetting polyimide resin is not particularly limited, and examples thereof include condensation type polyimide resins obtained by copolymerizing an acid dianhydride and a diamine, bismaleimide resins, and maleimide resins.

As the acid dianhydride and the diamine, for example, any of aliphatic compounds, alicyclic compounds, and aromatic compounds can be used. From the viewpoint of heat resistance, as the acid dianhydride, aromatic tetracarboxylic dianhydrides are preferred, and as the diamine, aromatic diamines are preferred.

Examples of the acid dianhydride include pyromellitic dianhydride, 2,3,6,7-naphthalenetetracarboxylic dianhydride, 3,3',4,4'-biphenyltetracarboxylic dianhydride, 1,2,5,6-naphthalenetetracarboxylic dianhydride, 2,2',3,3'-biphenyltetracarboxylic dianhydride, 3,3',4,4'-benzophenonetetracarboxylic dianhydride, 4,4'-oxydiphthalic dianhydride, 2,2-bis(3,4-dicarboxyphenyl) propane dianhydride, 3,4,9,10-perylenetetracarboxylic dianhydride, bis(3,4-dicarboxyphenyl)propane dianhydride, 1,1-bis(2,3-dicarboxyphenyl)ethane dianhydride, 1,1-bis(3,4-dicarboxyphenyl)ethane dianhydride, bis(2,3-dicarboxyphenyl)methane dianhydride, bis(3,4-dicarboxyphenyl)ethane dianhydride, bis(3,4-dicarboxyphenyl) sulfone dianhydride, p-phenylenebis(trimellitic acid monoester acid anhydride), ethylenebis(trimellitic acid monoester acid anhydride), and bisphenol A bis(trimellitic acid monoester acid anhydride). One of these acid dianhydrides is used alone, or two or more of these acid dianhydrides are used in combination. Among these, at least one acid dianhydride selected from the group consisting of pyromellitic dianhydride, 2,3,6,7-naphthalenetetracarboxylic dianhydride, 2,2',3,3'-biphenyltetracarboxylic dianhydride, 3,3',4,4'-biphenyltetracarboxylic dianhydride, and 3,3',4,4'-benzophenonetetracarboxylic dianhydride is preferred from the viewpoint of heat resistance and dimensional stability.

Examples of the diamine include 4,4'-diaminodiphenylpropane, 4,4'-diaminodiphenylmethane, benzidine, 3,3'-dichlorobenzidine, 3,3'-dimethylbenzidine, 2,2'-dimethylbenzidine, 3,3'-dimethoxybenzidine, 2,2'-dimethoxybenzidine, 4,4'-diaminodiphenyl sulfide, 3,3'-diaminodiphenyl sulfone, 4,4'-diaminodiphenyl sulfone, 4,4'-oxydianiline, 3,3'-oxydianiline, 3,4'-oxydianiline, 1,5-diaminonaphthalene, 2,6-diaminonaphthalene, 4,4'-diaminodiphenyldiethylsilane, 4,4'-diaminodiphenylsilane, 4,4'-diaminodiphenylethylphosphine oxide, 4,4'-diaminodiphenyl N-methylamine, 4,4'-diaminodiphenyl N-phenylamine, 1,4-diaminobenzene (p-phenylenediamine), 1,3-diaminobenzene, 1,2-diaminobenzene, bis{4-(4-aminophenoxy)phenyl} sulfone, bis{4-(3-aminophenoxy)phenyl} sulfone, 4,4'-bis(4-aminophenoxy)biphenyl, 4,4'-bis(3-aminophenoxy)biphenyl, 1,3-bis(3-aminophenoxy)benzene, 1,3-bis(4-aminophenoxy)benzene, 1,4-bis(4-aminophenoxy)benzene, 3,3'-diaminobenzophenone, 4,4'-diaminobenzophenone, and 2,2-bis[4-(4-aminophenoxy)phenyl)]propane. One of these diamines is used alone, or two or more of these diamines are used in combination. Among these, at least one diamine selected from the group consisting of 3,3'-dimethylbenzidine, 2,2'-dimethylbenzidine, 3,3'-dimethoxybenzidine, 2,2'-dimethoxybenzidine, 1,5-diaminonaphthalene, and 1,4-diaminobenzene (p-phenylenediamine) is preferably contained from the viewpoint of heat resistance and dimensional stability.

The substrate may or may not contain components other than resins in a range that does not impair the operation and effect of the present invention.

The substrate is preferably a resin film, and the resin film is more preferably a thermosetting polyimide resin film. For the thermosetting polyimide resin film, a prepared product prepared by a known method, or a commercial product may be used. Examples of the commercial product include "Kapton EN series", "Kapton H series", and "Kapton V series", products of DU PONT-TORAY CO., LTD., "APICAL HP series" and "APICAL NPI series", products of KANEKA CORPORATION, and "Upilex S", a product of Ube Industries, Ltd.

The thickness of the substrate in the lamination direction is preferably 5 μm to 500 μm from the viewpoint of conveying properties, insulating properties, heat resistance, and the like. From a similar viewpoint, the thickness is more preferably 7.5 μm to 300 μm, further preferably 10 μm to 100 μm.

(Plating-Forming Layer)

The plating-forming layer should be disposed on one surface of both surfaces of the substrate and may be disposed on both surfaces of the substrate. The plating-forming layer comprises a thermoplastic resin and a plating catalyst.

(Thermoplastic Resin)

The thermoplastic resin refers to, for example, a resin that has a softening point temperature because it softens when heated at the glass transition temperature (hereinafter also referred to as Tg) or more. The thermoplastic resin may be in an uncured form or in a cured form. Examples of the thermoplastic resin include thermoplastic polyimide resins, aromatic polyether ketones, polyphenylene sulfide, polyethylene, polypropylene, polybutene, crystalline polybutadiene, polymethylpentene, polyamides, polyesters, polyurethanes, liquid crystal polymers, and polystyrene. One of these thermoplastic resins is used alone, or two or more of these thermoplastic resins are used in combination. Among these, the thermoplastic resin is preferably a thermoplastic polyimide resin from the viewpoint of further improving the solder heat resistance. The thermoplastic polyimide resin refers to, for example, a polyimide resin in which the modulus at 300° C. is less than 20% with respect to the modulus at 30° C.

In the laminate of this embodiment, it is preferred that the substrate is a thermosetting polyimide resin, and the thermoplastic resin contained in the plating-forming layer is a thermoplastic polyimide resin. Thus, the close adhesiveness between the substrate and the plating-forming layer tends to improve further.

Examples of the thermoplastic polyimide resin include polyimide resins obtained by copolymerizing an acid dianhydride and a diamine. Examples of the acid dianhydride and the diamine include acid dianhydrides and diamines similar to those used for the thermosetting polyimide resin described above.

The content of the thermoplastic resin based on the entire plating-forming layer is, for example, 1% by mass to 99% by mass, preferably 20% by mass to 95% by mass, and more preferably 40% by mass to 90% by mass.

(Plating Catalyst)

The plating catalyst contains a precious metal. The plating catalyst should be a catalyst usually used for plating treatment (for example, electroless plating treatment). Examples of the precious metal include palladium, silver, platinum, nickel, gold, and alloys thereof. These precious metals may be present in the plating-forming layer in the form of ions. One of these precious metals is used alone, or two or more of these precious metals are used in combination. Among these, the precious metal is preferably palladium and/or silver. By using such a precious metal, plating can be performed with the thickness of a metal plating layer decreased, when the metal plating layer (for example, a copper plating layer) is formed on the plating-forming layer. Therefore, a finer circuit tends to be able to be formed.

For the plating catalyst, the precious metal is desirably colloidally or uniformly dispersed in a solvent from the viewpoint of uniformly depositing the plating layer on the surface of the adhesive layer. The solvent is not particularly limited, and examples thereof include those usually used for dispersing particles of a precious metal, and examples thereof include water, alcohols such as methanol, ethanol, and isopropyl alcohol, hexane, cyclohexanone, methyl ethyl ketone, acetone, N-methyl-2-pyrrolidone, N,N-dimethylacetamide, N,N-dimethylformamide, toluene, diethyl ether, tetrahydrofuran (THF), and mixed solvents thereof.

The average particle diameter (D50) of particles of the precious metal may be, for example, about 2 nm to 40 nm. The average particle diameter is a volume-based average particle diameter and is obtained, for example, by a particle diameter distribution measuring apparatus according to a dynamic light scattering method (DLS). D50 means the position of a volume accumulation of 50%.

When the average particle diameter (D50) of the particles of the precious metal is 40 nm or less, the surface area of the precious metal increases, and the catalytic activity increases. Thus, the reactivity of the plating tends to improve.

The content of the plating catalyst based on the entire plating-forming layer is, for example, 1% by mass to 99% by mass, preferably 5% by mass to 80% by mass, and more preferably 10% by mass to 60% by mass.

(Dispersing Agent)

The plating-forming layer contains a dispersing agent for dispersing the plating catalyst. However, the dispersing agent is not necessarily essential as long as the plating-forming layer satisfies the condition that "(2) the abundance of the plating catalyst on the surface side of the plating-forming layer $(C_a)$ is higher than the abundance of the plating catalyst on the substrate side of the plating-forming layer $(C_b)$". The dispersing agent is preferably a compound that interacts with and binds the metal atom (catalytic metal) contained in the plating catalyst, and the compound is more preferably a compound in which the end group of the compound is a functional group containing a nitrogen atom, and a compound having an unsaturated bond. The form of the bond may be, for example, a coordinate bond, an ionic bond, or a covalent bond. By using such a dispersing agent, the catalytic metal is uniformly dispersed in the plating-forming layer. Due to this dispersion, the proportion of contact between the catalytic metal and the plating metal increases further, and therefore the deposition properties of the plating metal improve. As a result, the occurrence of pinholes decreases greatly in the plating-forming layer.

The content of the dispersing agent based on the entire plating-forming layer is, for example, 1% by mass to 99% by mass, preferably 10% by mass to 80% by mass, and more preferably 20% by mass to 60% by mass.

When the abundance of the plating catalyst on the surface side of the plating-forming layer is $C_a$, and the abundance of the plating catalyst on the substrate side of the plating-forming layer is $C_b$, the plating-forming layer satisfies $C_a > C_b$. However, the plating-forming layer need not necessarily satisfy $C_a > C_b$ when it satisfies the condition of the above (1). $C_a$ and $C_b$ are obtained using an X-ray photoelectron spectroscopy analyzer. That is, when the precious metal contained in the plating catalyst is palladium (Pd), the abundance of the catalyst (palladium abundance (Pd abundance)) on the surface side of the plating-forming layer is obtained from the atomic % concentration of Pd detected by measuring from the surface side using an X-ray photoelectron spectroscopy analyzer. Specifically, the numerical value obtained by dividing the atomic % concentration of palladium (Pd) by the atomic % concentration of carbon (C) is the abundance of the catalyst (palladium abundance (Pd abundance)) $C_a$. For the abundance of the catalyst on the substrate side of the plating-forming layer, treatment is performed with argon ions from the surface side of the plating-forming layer, and the treatment is performed to a predetermined place, and then the abundance of the plating catalyst (palladium abundance (Pd abundance)) on the substrate side of the plating-forming layer, $C_b$, is obtained by a method similar to the above using an X-ray photoelectron spectroscopy analyzer.

Thus, the proportion of contact of the plating metal with the catalytic metal increases. It is considered that as a result, the catalytic metal and the plating metal are likely to be in contact with each other, and the adhesiveness (adhesiveness in the normal state and adhesiveness focused on the assumption of long-term reliability) and solder heat resistance of the laminate improve.

Examples of means for satisfying $C_a > C_b$ include forming a resin layer containing a thermoplastic resin on a substrate and laminating a catalyst layer containing the above dispersing agent on the resin layer.

The thickness of the plating-forming layer is, for example, 10 nm to 10 μm, and preferably 30 nm to 8 μm, more preferably 50 nm to 6 μm, from the viewpoint of more effectively and reliably achieving the operation and effect of the present invention.

The plating-forming layer may have a single layer structure or a multilayer structure. When the plating-forming layer has a multilayer structure, the multilayer structure preferably comprises a resin layer containing a thermoplastic resin, and a catalyst layer containing a plating catalyst, from the viewpoint of further improving the adhesiveness and the solder heat resistance, and the catalyst layer preferably further contains the above dispersing agent. When the plating-forming layer has the above multilayer structure, for example, the resin layer is disposed (formed) on the substrate, and the catalyst layer is disposed (formed) on the resin layer.

(Resin Layer)

Examples of the thermoplastic resin contained in the resin layer include thermoplastic resins similar to those used in the plating-forming layer described above.

The thickness of the resin layer is, for example, 10 nm to 10 μm, and preferably 30 nm to 8 μm, more preferably 50 nm to 6 μm, from the viewpoint of more effectively and reliably achieving the operation and effect of the present invention.

(Catalyst Layer)

Examples of the plating catalyst and the dispersing agent contained in the catalyst layer include the plating catalysts and the dispersing agents illustrated in the section on the plating-forming layer, respectively.

The thickness of the catalyst layer is, for example, 5 nm to 300 nm, and preferably 10 nm to 200 nm, more preferably 20 nm to 100 nm, from the viewpoint of more effectively and reliably achieving the operation and effect of the present invention.

The multilayer structure may be composed of only a resin layer and a catalyst layer or may be composed of a resin layer, a catalyst layer, and one or more other layers other than a resin layer and a catalyst layer.

Among these, the plating-forming layer preferably further comprises a resin layer, a catalyst layer, and a boundary layer disposed between the resin layer and the catalyst layer. The boundary layer is formed, for example, by the infiltration of the plating catalyst and the dispersing agent into the surface layer of the resin layer. When the plating-forming layer comprises such a boundary layer, the interlayer close adhesiveness between the resin layer and the catalyst layer improves, and as a result, the peel strength tends to be better.

The thickness of the boundary layer is, for example, 0.5 nm to 300 nm, and preferably 1 nm to 200 nm, more preferably 2 nm to 100 nm, from the viewpoint of more effectively and reliably achieving the operation and effect of the present invention.

The laminate of this embodiment may or may not comprise a plating layer disposed on plating formation.

(Plating Layer)

Examples of the plating layer include a metal plating layer formed by metal plating treatment. Examples of the metal plating layer include a copper plating layer, a gold plating layer, a tin plating layer, a nickel plating layer, a silver plating layer, a palladium plating layer, a solder plating layer, and a lead-free solder plating layer.

The thickness of the plating layer is preferably 0.05 μm to 35 μm, more preferably 0.1 μm to 18 μm, and further preferably 0.1 μm to 12 μm from the viewpoint of more effectively and reliably achieving the operation and effect of the present invention.

The laminate of this embodiment may have a form in which the plating-forming layer and the plating layer are laminated in this order on one surface side of the substrate, or a form in which the plating-forming layer and the plating layer are laminated in this order on both surface sides of the substrate. When the laminate of this embodiment has a form in which the plating-forming layer and the plating layer are laminated in this order on both surface sides of the substrate, the plating-forming layer has, for example, a first plating-forming layer formed on one surface of both surfaces of the substrate, and a second plating-forming layer formed on the other surface of both surfaces of the substrate, and the plating layer has a first plating layer formed on the surface of the first plating-forming layer, and a second plating layer formed on the surface of the second plating-forming layer. The first plating-forming layer and the second plating-forming layer may be the same or different.

(Characteristics)

The laminate of this embodiment is excellent in adhesiveness in the normal state, and the peel strength in 90° direction peeling is, for example, 5.0 N/cm or more (for example, 5.0 N/cm to 8.0 N/cm), preferably 6.0 N/cm or more, and more preferably 6.5 N/cm or more.

The laminate of this embodiment is excellent in adhesiveness focused on the assumption of long-term reliability. Therefore, the peel strength after charging into a dryer at a temperature of 150° C. for 240 h is, for example, 5.0 N/cm or more (for example, 5.0 N/cm to 8.0 N/cm), preferably 6.0 N/cm or more, and more preferably 6.5 N/cm or more in the 90° peeling direction. The peel strength after charging into a thermo-hygrostat at a temperature of 85° C. and a humidity of 85% for 240 h is, for example, 5.0 N/cm or more (for example, 5.0 N/cm to 8.0 N/cm), preferably 6.0 N/cm or more, and more preferably 6.5 N/cm or more in terms of 90° direction peeling.

(Applications)

The laminate of this embodiment is preferably used for a flexible printed circuit material for which the formation of a fine wiring circuit is required. A flexible printed circuit is preferably used, for example, as a so-called chip-on flexible printed circuit for IC chip mounting or a flexible printed circuit for high density circuit formation.

[Method for Manufacturing Laminate]

The method for manufacturing a laminate in this embodiment, for example, comprises the plating-forming layer forming step of applying a thermoplastic resin and a plating catalyst raw material comprising the above dispersing agent as needed, to at least one surface of a substrate, and drying the thermoplastic resin and the plating catalyst raw material to form a plating-forming layer, and may further comprise the plating layer forming step of performing plating treatment on the surface of the plating-forming layer opposite to the substrate to form a plating layer. Since the manufacturing method of this embodiment has the above configuration, the adhesiveness in the normal state and solder heat resistance of the obtained laminate tend to be able to be improved.

(Plating-Forming Layer Forming Step)

The plating-forming layer forming step is the step of applying a thermoplastic resin and a plating catalyst raw material on a substrate and drying the thermoplastic resin and the plating catalyst raw material to form a plating-forming layer.

The substrate is not particularly limited, and examples thereof include those illustrated as the substrate in the section on the laminate.

The thermoplastic resin is not particularly limited, and examples thereof include those illustrated as the thermoplastic resin in the section on the laminate. In the plating-forming layer forming step, for example, the thermoplastic resin is used in the form of being dissolved or dispersed in an organic solvent. The organic solvent is not particularly limited as long as it is a solvent capable of dissolving or dispersing the thermoplastic resin. Examples thereof include alcohols (for example, methanol, ethanol, propanol, butanol, pentanol, glycerin, ethylene glycol, diethylene glycol, triethylene glycol, polyethylene glycol, propylene glycol, dipropylene glycol, trimethylolethane, and trimethylolpropane), ethers (for example, alkyl ethers such as butyl ethyl ether, polyhydric alcohol alkyl ethers such as ethylene glycol mono-n-butyl ether, and polyhydric alcohol aryl ethers such as ethylene glycol monophenyl ether), ketones (for example, methyl ethyl ketone, methyl isobutyl ketone, and cyclopentanone), esters (for example, butyl acetate, propyl propionate, and methyl ether acetate), amides (for example, N,N-dimethylformaldehyde and N,N-dimethylacetamide), amines (for example, monoethanolamine and diethanolamine), aromatic hydrocarbons (for example, toluene and xylene), sulfur-containing compounds (for example, dimethyl sulfoxide), and nitrogen-containing heterocyclic compounds (for example, N-methyl-2-pyrrolidone and Y-butyrolactone). One of these organic solvents is used alone, or two or more of these organic solvents are used in combination. The concentration of the thermoplastic resin in the organic solvent may be, for example, about 0.1% by mass to 20% by mass.

The plating catalyst raw material contains a precious metal. The precious metal is not particularly limited, and examples thereof include palladium, silver, gold, platinum, nickel, and alloys thereof. One of these precious metals is used alone, or two or more of these precious metals are used in combination.

For the plating catalyst raw material, a precious metal may be directly added, or a precious metal compound and a reducing agent for reducing the precious metal compound to obtain a precious metal may be added to deposit the precious metal in the plating catalyst raw material by a reduction reaction. The precious metal compound is not particularly limited, and examples thereof include palladium compounds (for example, palladium chloride, palladium fluoride, palladium bromide, palladium iodide, palladium nitrate, palladium sulfate, palladium oxide, and palladium sulfide), silver compounds (for example, silver nitrate, silver fluoride, silver oxide, and silver acetate), gold compounds (for example, gold cyanide, gold trichloride, gold tribromide, gold potassium chloride, gold potassium cyanide, gold sodium chloride, and gold sodium cyanide), platinum compounds (for example, platinum chloride and platinum sulfate), and nickel compounds (for example, nickel chloride and nickel sulfate). One of these precious metal compounds is used alone, or two or more of these precious metal compounds are used in combination.

The reducing agent is not particularly limited, and examples thereof include metal borohydride salts (for example, sodium borohydride and potassium borohydride), aluminum hydride salts (for example, lithium aluminum hydride, potassium aluminum hydride, cesium aluminum hydride, beryllium aluminum hydride, magnesium aluminum hydride, and calcium aluminum hydride), hydrazine compounds, carboxylic acids (for example, citric acid, formic acid, acetic acid, fumaric acid, malic acid, succinic acid, ascorbic acid, and salts thereof), primary or secondary alcohols (for example, methanol, ethanol, isopropanol, and polyols), tertiary amines (for example, trimethylamine, triethylamine, diisopropylethylamine, diethylmethylamine, tetramethylethylenediamine [TMEDA], and ethylenediaminetetraacetic acid [EDTA]), hydroxylamine, ketones (for example, acetone and methyl ethyl ketone), ethers (for example, diethyl ether), aldehydes (for example, formaldehyde and acetaldehyde), esters (for example, methyl formate, methyl acetate, and ethyl acetate), and phosphines (for example, tri-n-propylphosphine, tri-n-butylphosphine, tricyclohexylphosphine, tribenzylphosphine, triphenylphosphine, triethoxyphosphine, 1,2-bis(diphenylphosphino)ethane [DPPE], 1,3-bis(diphenylphosphino)propane [DPPP], 1,1'-bis(diphenylphosphino)ferrocene [DPPF], and 2,2'-bis(diphenylphosphino)-1,1'-binaphthyl [BINAP]). One of these reducing agents is used alone, or two or more of these reducing agents are used in combination.

The amount of the reducing agent used is not particularly limited and may be, for example, about 10 parts by mass to 1000 parts by mass based on 100 parts by mass of the precious metal compound.

Examples of the dispersing agent include those illustrated as the dispersing agent in the section on the laminate. In the plating-forming layer forming step, for example, the dispersing agent is used in the form of being dissolved or dispersed in an organic solvent. Examples of the organic solvent include those illustrated as the solvent capable of dissolving or dispersing the thermoplastic resin. The concentration of the dispersing agent in the organic solvent may be, for example, about 0.1% by mass to 10% by mass.

In the plating-forming layer forming step, it is possible to apply, on at least one surface of a substrate, a mixed raw material obtained by mixing a thermoplastic resin, a plating catalyst raw material, and a dispersing agent as needed, and dry the mixed raw material to form a plating-forming layer. In the plating-forming layer forming step, it is possible to apply a thermoplastic resin on at least one surface of a substrate and dry the thermoplastic resin to form a resin layer, and apply a plating catalyst raw material, and a dispersing agent as needed, on the surface of the resin layer and dry the plating catalyst raw material, and the dispersing agent as needed, to form a catalyst layer. In this case, the plating-forming layer is composed of the resin layer and the catalyst layer.

The method for applying each of the thermoplastic resin, the plating catalyst raw material, and the dispersing agent as needed, in the plating-forming layer forming step is not particularly limited, and examples thereof include a roll coating method, a kiss roll coating method, a gravure coating method, a reverse coating method, a roll brush method, a spray coating method, a dip roll coating method, a bar coating method, a knife coating method, an air knife coating method, a curtain coating method, a lip coating method, and a die coater method.

For the drying conditions in the plating-forming layer forming step, the drying temperature and time can be appropriately set according to the organic solvent used. The range of the drying temperature is, for example, about 60° C. to 300° C., and the drying time is, for example, about 5 min to 60 min. The drying temperature may be changed stepwise or kept constant.

(Plating Layer Forming Step)

The plating layer forming step is the step of performing plating treatment on the surface of the adhesive layer opposite to the substrate to form a plating layer. Examples of the plating treatment include electroless plating treatment, electroplating treatment, and treatment combining these. Among these plating treatments, electroless plating treatment is preferably used because it can be applied to a semi-additive method, which is one of pattern forming methods, and can adapt to pitch narrowing on both surfaces.

As the treatment conditions of electroless plating treatment and electroplating treatment, known treatment conditions are used. More particularly, the treatment conditions described in Examples are used.

The physical properties herein can be measured according to the methods described in the following Examples unless otherwise specified.

EXAMPLES

The present invention will be more specifically described below by Examples and Comparative Examples, but the present invention is not limited to only these Examples.

Synthesis Examples of thermoplastic resins that are the raw materials of the resin layers of the present invention will be specifically described below, but the present invention is not limited to only these Synthesis Examples.

The acid dianhydride, the diamines, and the solvents used for the synthesis of the thermoplastic resins are as follows.
 p-PDA: p-phenylenediamine (manufactured by KANTO CHEMICAL CO., INC.)
 BAPP: 2,2-bis(4-aminophenoxyphenyl)isopropane (manufactured by Wakayama Seika Kogyo Co., Ltd.)
 TPE-R: 1,3-bis(4-aminophenoxy)benzene (manufactured by Wakayama Seika Kogyo Co., Ltd.)
 4,4'-DPE: 4,4'-diaminodiphenyl ether (manufactured by Wakayama Seika Kogyo Co., Ltd.)
 BPDA: 3,4,3',4'-biphenyltetracarboxylic dianhydride (manufactured by Ube Industries, Ltd.)
 DMAc: N,N-dimethylacetamide (manufactured by KANTO CHEMICAL CO., INC.)
 NMP: N-methyl-2-pyrrolidone (manufactured by KANTO CHEMICAL CO., INC.)

Synthesis Example 1

85 g of DMAc, 1.034 g (0.003 mol) of BAPP, and 6.628 g (0.023 mol) of TPE-R were added to a reaction container and then stirred at room temperature to dissolve BAPP and TPE-R in DMAc. 7.338 g (0.025 mol) of BPDA was gradually added to the obtained solution. Then, the mixture was stirred at room temperature for 3 h to obtain a resin composition (polyamic acid solution). The obtained polyamic acid solution was diluted with DMAc so that the solid concentration of the polyamic acid solution was 2% by mass, to obtain a polyamic acid solution A.

Synthesis Example 2

85 g of DMAc, 5.645 g (0.014 mol) of BAPP, and 2.680 g (0.009 mol) of TPE-R were added to a reaction container and then stirred at room temperature to dissolve BAPP and TPE-R in DMAc. 6.675 g (0.023 mol) of BPDA was gradually added to the obtained solution. Then, the mixture was stirred at room temperature for 3 h to obtain a resin composition (polyamic acid solution). The obtained polyamic acid solution was diluted with DMAc so that the solid concentration of the polyamic acid solution was 2% by mass, to obtain a polyamic acid solution B.

Synthesis Example 3

85 g of DMAc and 4.061 g (0.038 mol) of p-PDA were added to a reaction container and then stirred at 40° C. to dissolve p-PDA in DMAc. 10.939 g (0.037 mol) of BPDA was gradually added to the obtained solution. Then, the mixture was stirred at room temperature for 3 h to obtain a resin composition (polyamic acid solution). The obtained polyamic acid solution was diluted with DMAc so that the solid concentration of the polyamic acid solution was 2% by mass, to obtain a polyamic acid solution C.

Example 1

The 2% by mass polyamic acid solution A, which was a solution of a precursor resin of a thermoplastic polyimide resin, synthesized in Synthesis Example 1 was applied to one surface of a thermosetting polyimide resin film having a thickness of 38 μm ("Kapton 150EN-C, linear thermal expansion coefficient 13 ppm, glass transition temperature 320° C., Ra 0.03 μm", product of DU PONT-TORAY CO., LTD.) as a substrate using a bar coater, and dried under the drying conditions of 60° C. to 250° C. and about 10 min to form a resin layer having a thickness of 150 nm (resin layer forming step). Next, an agent A containing Pd as a plating catalyst and containing a dispersing agent having an ammonium group (CP series manufactured by Nissan Chemical Industries, Ltd.) was applied to the resin layer surface using a bar coater, dried at 120° C. for about 10 min, and further dried at 250° C. for about 15 min to form a catalyst layer having a thickness of 50 nm (catalyst layer forming step). The formed-body formed in this manner was immersed in OPC COPPER HFS (initial Cu concentration 2.5 g/l, bath volume 500 ml, 40° C., 40 min), a product of Okuno Chemical Industries Co., Ltd., for about 5 min to form a metal plating layer having a thickness of 0.3 μm on the surface of the catalyst layer (chemical plating step). Further, the thickness of the metal plating layer was changed from 0.3 μm to 12 μm by electrolytic plating treatment (electrolytic plating step). Thus, a laminate was obtained. When a cross-sectional view of the obtained laminate was observed using a scanning electron microscope, it was seen that in the laminate, a boundary layer was formed between the resin layer and the catalyst layer. A cross-sectional view of the obtained laminate is shown in FIG. 1. As shown in FIG. 1, in this laminate, the resin layer, the boundary layer, and the catalyst layer were laminated in this order on the substrate.

Example 2

A laminate was obtained as in Example 1 except that the 2% by mass polyamic acid solution B, which was a solution of a precursor resin of a thermoplastic polyamide resin, synthesized in Synthesis Example 2 was used instead of the 2% by mass polyamic acid solution A, which was a solution of a precursor resin of a thermoplastic polyimide resin, synthesized in Synthesis Example 1, in the resin layer forming step.

Comparative Example 1

A laminate was obtained as in Example 1 except that the 2% by mass polyamic acid solution C, which was a solution of a precursor resin of a thermosetting polyimide resin, synthesized in Synthesis Example 3 was used instead of the 2% by mass polyamic acid solution A, which was a solution of a precursor resin of a thermoplastic polyimide resin, synthesized in Synthesis Example 1, in the resin layer forming step.

Comparative Example 2

A laminate was obtained as in Example 1 except that the resin layer forming step was not performed, and the above agent A was applied to one surface of the substrate in the catalyst layer forming step.

Example 3

A solution obtained by mixing the 2% by mass polyamic acid solution A, which was a solution of a precursor resin of a thermoplastic polyimide resin, synthesized in Synthesis Example 1 and the agent A of Example 1 at 10:1 in mass ratio (the resin concentration was 0.5% by mass, and the Pd concentration was 0.136% by mass) was applied to one surface of the substrate using a bar coater, dried at 120° C. for about 10 min, and further dried at 250° C. for about 15 min to form a plating-forming layer having a thickness of 100 nm. The formed-body formed in this manner was immersed in OPC COPPER HFS (initial Cu concentration 2.5 g/l, bath volume 500 ml, 40° C., 40 min), a product of Okuno Chemical Industries Co., Ltd., for about 5 min to form a metal plating layer having a thickness of 0.3 μm on the surface of the catalyst layer (chemical plating step). Further, the thickness of the metal plating layer was changed from 0.3 μm to 12 μm by electrolytic plating treatment (electrolytic plating step). Thus, a laminate was obtained.

Example 4

A 25 μm bond ply film having thermoplastic polyimide resin layers on both surfaces of a thermosetting resin layer, "PIXEO FRS-142, linear expansion coefficient 20 ppm", a product of KANEKA CORPORATION, as a substrate was immersed in a 10 wt % KOH aqueous solution at 40° C. for about 60 min to swell the polyimide resin layers, and then on one surface of the bond ply film, an agent A containing Pd as a plating catalyst and containing a dispersing agent having an ammonium group was applied to the substrate surface using a bar coater, dried at 120° C. for about 10 min, and further dried at 250° C. for about 15 min to form a catalyst layer having a thickness of 50 nm. With the formed-body formed in this manner, a laminate was obtained as in Example 1.

Example 5

On one surface of a 25 μm bond ply film having thermoplastic polyimide resin layers on both surfaces of a thermosetting resin layer, "PIXEO FRS-142, linear expansion coefficient 20 ppm", a product of KANEKA CORPORATION, as a substrate, an agent A containing Pd as a plating catalyst and containing a dispersing agent having an ammonium group was applied to the substrate surface using a bar coater, dried at 120° C. for about 10 min, and further dried under a nitrogen atmosphere at 300° C. for about 30 min to form a catalyst layer having a thickness of 50 nm. With the formed-body formed in this manner, a laminate was obtained as in Example 1.

The physical properties of the laminates of the Examples and the Comparative Examples were measured. The measurement results are shown in Table 1. From these measurement results, it was seen that when the presence of the metals that were the plating and the plating catalyst raw material was low in the resin layer on the substrate side, a decrease in peel strength after heat treatment or after moist heat treatment was suppressed. As one of the causes of this, it is considered that since the presence of the metals in the resin layer is low, the influence of the heat applied to the resin is small, though this is a presumption. The methods for measuring the physical properties were performed by the following methods.

The evaluation methods and the measurement methods are as follows.

[Thicknesses of Layers]

For the measurement of the thicknesses of the layers, a sample was cut to a thickness of 50 to 150 nm by an ultramicrotome EM UC6 (manufactured by LEICA), and for the cross section, a cross-sectional transmission image was observed using a scanning electron microscope S-4800 (manufactured by Hitachi), and the thicknesses were calculated therefrom.

[Palladium Abundance]

For the measurement of palladium abundance, it was measured using an X-ray photoelectron spectroscopy analyzer. More particularly, the abundance of the catalyst (palladium abundance (Pd abundance)) on the surface side of the plating-forming layer was obtained from the atomic % concentration of Pd detected by measuring from the surface side using an X-ray photoelectron spectroscopy analyzer. Specifically, the numerical value obtained by dividing the atomic % concentration of palladium (Pd) by the atomic % concentration of carbon (C) was the abundance of the catalyst (palladium abundance (Pd abundance)). For the abundance of the catalyst on the substrate side of the plating-forming layer, treatment was performed with argon ions from the substrate side, and the treatment was performed to a predetermined place, and then the abundance of the plating catalyst (palladium abundance (Pd abundance)) on the substrate side of the plating-forming layer was obtained by a method similar to the above using an X-ray photoelectron spectroscopy analyzer.

(Evaluation Criteria)
○: surface side>substrate side (Ca>Cb) for the abundance of Pd was confirmed.
X: surface side>substrate side (Ca>Cb) for the abundance of Pd could not be confirmed.

[Peel Strength in Normal State]

The measurement of peel strength was performed in accordance with JIS C6471. More particularly, an etching resist having a width of 3 mm was patterned on the copper plating layer surface of each laminate, and then the remaining copper plating layer was removed by etching to obtain a sample. The obtained sample was fixed to a reinforcing plate with double-sided tape, the copper plating layer was peeled from the reinforcing plate in the 90° direction, and strength measurement was performed to measure the peel strength. The peel speed was 50 mm/min. The evaluation criteria in the table are as follows.

(Evaluation Criteria)
○: The peel strength was 5 N or more.
Δ: The peel strength was 3 N or more and less than 5 N.
X: The peel strength was less than 3 N.

[Solder Heat Resistance Test]

Each laminate was cut to 30 mm×30 mm. Floating treatment was performed for 60 s with the copper plating layer side of each laminate being on the solder bath side. The appearance after the treatment was visually confirmed to confirm the presence or absence of shrinkage, blistering, and peeling. The test was performed every 10° C. from 240° C. to 340° C. to obtain the maximum temperature at which there was no shrinkage, blistering, and peeling. In Table 1, a case where any of shrinkage, blistering, and peeling occurred at 240° C. is described as "less than 240° C.", and a case where none of shrinkage, blistering, and peeling is seen at 340° C. is described as "340° C.<".

TABLE 1

|  |  | Unit | Example 1 | Example 2 | Example 3 | Example 4 | Example 5 | Comparative Example 1 | Comparative Example 2 |
|---|---|---|---|---|---|---|---|---|---|
| Plating-forming layer thickness | | nm | 200 | 200 | 100 | 4050 | 4050 | 200 | 50 |
| Resin layer thickness | | nm | 150 | 150 | 100 | 4000 | 4000 | 150 | — |
| Catalyst layer thickness | | nm | 50 | 50 | — | 50 | 50 | 50 | 50 |
| Peel strength | Normal state | Evaluation | ○ | ○ | ○ | ○ | ○ | X | X |
| | | N/cm | 7 | 7.3 | 7 | 6.5 | 6.7 | 2 | 0.2 |
| | After heat treatment | Evaluation | ○ | ○ | X | ○ | ○ | X | X |
| | | N/cm | 6.8 | 7 | 0.8 | 6.3 | 6.5 | 1.5 | 0.1 |
| | After moist heat treatment | Evaluation | ○ | ○ | ○ | ○ | ○ | X | X |
| | | N/cm | 7.5 | 7.5 | 6 | 6.6 | 6.5 | 1.8 | 0.1 |
| Solder heat resistance | | — | 340° C.< | 340° C.< | 340° C.< | 340° C.< | 340° C.< | 340° C.< | Less than 240° C. |
| $C_a > C_b$ | | — | ○ | ○ | X | ○ | ○ | ○ | X |

(Evaluation Criteria)
○: The peel strength was 5 N or more.
Δ: The peel strength was 3 N or more and less than 5 N.
X: The peel strength was less than 3 N.

[Peel Strength after Heat Treatment]

An etching resist was patterned to a width of 3 mm on the copper plating layer surface of each laminate, and then the remaining copper plating layer was removed by etching to obtain a sample. The sample was stored in a dryer adjusted at a temperature of 150° C. for 240 h. The sample taken out of the dryer was fixed to a reinforcing plate with double-sided tape, the copper plating layer was peeled from the reinforcing plate in the 90° direction, and the peel strength was measured. The peel speed was 50 mm/min. The evaluation criteria in the table are as follows.

(Evaluation Criteria)
○: The peel strength was 5 N or more.
Δ: The peel strength was 3 N or more and less than 5 N.
X: The peel strength was less than 3 N.

[Peel Strength after Moist Heat Treatment]

An etching resist was patterned to a width of 3 mm on the copper plating layer surface of each laminate, and then the remaining copper plating layer was removed by etching to obtain a sample. The sample was stored in a thermo-hygrostat adjusted at a temperature of 85° C. and a humidity of 85% for 240 h. The sample taken out of the dryer was fixed to a reinforcing plate with double-sided tape, the copper plating layer was peeled from the reinforcing plate in the 90° direction, and the peel strength was measured. The peel speed was 50 mm/min. The evaluation criteria in the table are as follows.

This application is based on Japanese Patent Application No. 2018-166271 filed with the Japan Patent Office on Sep. 5, 2018, the contents of which are incorporated herein by reference.

INDUSTRIAL APPLICABILITY

The laminate of the present invention has industrial applicability as a material used for a flexible printed circuit.

The invention claimed is:

1. A laminate comprising:
a substrate; and
a plating-forming layer disposed on at least one surface of both surfaces of the substrate,
wherein the plating-forming layer comprises a resin layer containing a thermoplastic resin, a catalyst layer disposed on the resin layer and containing a plating catalyst, and a boundary layer which is disposed between the resin layer and the catalyst layer and in which the plating catalyst and a dispersing agent for dispersing the plating catalyst infiltrate into the thermoplastic resin.

2. The laminate according to claim 1, wherein the dispersing agent is a compound that interacts with and binds to a metal atom contained in the plating catalyst.

3. The laminate according to claim 2, wherein an end group of the compound is a functional group containing a nitrogen atom.

4. The laminate according to claim 1, wherein the catalyst layer contains the dispersing agent.

5. The laminate according to claim 1, wherein the substrate is a thermosetting polyimide resin.

6. The laminate according to claim 1, wherein the thermoplastic resin is a thermoplastic polyimide resin.

7. The laminate according to claim 1, wherein the plating catalyst contains palladium and/or silver.

8. The laminate according to claim 1, further comprising a metal plating layer disposed on the plating-forming layer.

9. The laminate according to claim 1, wherein an abundance of the plating catalyst on a surface side of the plating-forming layer is higher than an abundance of the plating catalyst on the substrate side of the plating-forming layer.

* * * * *